(12) United States Patent
Takeuchi et al.

(10) Patent No.: US 7,863,630 B2
(45) Date of Patent: Jan. 4, 2011

(54) LIGHT-EMITTING DIODE AND METHOD FOR FABRICATION THEREOF

(75) Inventors: Ryouichi Takeuchi, Chichibu (JP);
Atsushi Matsumura, Chichibu (JP);
Takashi Watanabe, Chichibu (JP)

(73) Assignee: Showa Denko K.K., Tokyo (JP)

( * ) Notice: Subject to any disclaimer, the term of this patent is extended or adjusted under 35 U.S.C. 154(b) by 491 days.

(21) Appl. No.: 11/994,606

(22) PCT Filed: Jul. 5, 2006

(86) PCT No.: PCT/JP2006/313806
§ 371 (c)(1),
(2), (4) Date: Feb. 19, 2008

(87) PCT Pub. No.: WO2007/004745
PCT Pub. Date: Jan. 11, 2007

(65) Prior Publication Data
US 2008/0315176 A1    Dec. 25, 2008

Related U.S. Application Data

(60) Provisional application No. 60/697,959, filed on Jul. 12, 2005, provisional application No. 60/728,325, filed on Oct. 20, 2005, provisional application No. 60/763,927, filed on Feb. 1, 2006.

(30) Foreign Application Priority Data

| Jul. 5, 2005 | (JP) | ................ 2005-195747 |
| Oct. 14, 2005 | (JP) | ................ 2005-299599 |
| Jan. 23, 2006 | (JP) | ................ 2006-013554 |

(51) Int. Cl.
*H01L 21/00* (2006.01)

(52) U.S. Cl. ............ 257/88; 257/79; 257/80; 257/94; 257/103; 257/E33.005; 257/E33.008; 257/E33.069; 438/22; 438/47

(58) Field of Classification Search ............ 257/79, 257/80, 88, 94, 103, E33.005, E33.008, E33.069; 438/22, 47
See application file for complete search history.

(56) References Cited

U.S. PATENT DOCUMENTS 6,682,950 B2    1/2004    Yang et al.

(Continued)

FOREIGN PATENT DOCUMENTS

JP    52-61982    5/1977

(Continued)

OTHER PUBLICATIONS

Toyoji Fukami et al.; "Semiconductor Engineering From Basic to Device"; Tokyo Denki University; Feb. 20, 1987, first edition.

(Continued)

*Primary Examiner*—Dao H Nguyen
(74) *Attorney, Agent, or Firm*—Sughrue Mion, PLLC (57) ABSTRACT

A light-emitting diode includes a substrate, a compound semiconductor layer including a p-n junction-type light-emitting part formed on the substrate, an electric conductor disposed on the compound semiconductor layer and formed of an electrically conductive material optically transparent to the light emitted from the light-emitting part and a high resistance layer possessing higher resistance than the electric conductor and provided in the middle between the compound semiconductor layer and the electric conductor. In the configuration of a light-emitting diode lamp, the electric conductor and the electrode disposed on the semiconductor layer on the side opposite to the electric conductor across the light-emitting layer are made to assume an equal electric potential by means of wire bonding. The light-emitting diode abounds in luminance and excels in electrostatic breakdown voltage.

22 Claims, 4 Drawing Sheets

U.S. PATENT DOCUMENTS

| | | |
|---|---|---|
| 6,794,211 B2 * | 9/2004 | Oh et al. ................ 438/47 |
| 6,797,990 B2 | 9/2004 | Udagawa |
| 7,488,987 B2 * | 2/2009 | Udagawa ................ 257/88 |
| 2002/0130328 A1 | 9/2002 | Oh et al. |
| 2003/0010989 A1 | 1/2003 | Yukimoto |
| 2003/0146711 A1 | 8/2003 | Tsujimura et al. |
| 2006/0131604 A1 | 6/2006 | Kozaki |

FOREIGN PATENT DOCUMENTS

| | | |
|---|---|---|
| JP | 10-200159 | 7/1998 |
| JP | 10-294525 A | 11/1998 |
| JP | 11-177133 A | 7/1999 |
| JP | 2000-174330 A | 6/2000 |
| JP | 2000-188425 | 7/2000 |
| JP | 2001-57441 | 2/2001 |
| JP | 3230638 | 9/2001 |
| JP | 2002-158373 | 5/2002 |
| JP | 2005-20038 | 1/2005 |
| JP | 2005-57228 | 3/2005 |
| TW | 559900 | 11/2003 |
| TW | 560060 | 11/2003 |
| TW | 580776 | 3/2004 |
| TW | 587355 | 5/2004 |

OTHER PUBLICATIONS

Hideto Sugawara, et al.; "High-Efficiency InGaAIP Visible Light-Emitting Diodes"; Jpn. J. Appl. Phys. vol. 31 (1992); pp. 2446-2451; Part I, No. 8, Aug. 1992.

TaekRyoung Chung, et al.; "1.3 µm InGaAsP/InP lasers on GaAs substrate fabricated by the surface activated wafer bonding method at room temperature"; Applied Physics Letters; vol. 72, No. 13, Mar. 30, 1998; pp. 1565-1566.

* cited by examiner

LIGHT-EMITTING DIODE AND METHOD FOR FABRICATION THEREOF

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/697,959 filed Jul. 12, 2005, No. 60/728,325 filed Oct. 20, 2005, No. 60/763,927 filed Feb. 1, 2006 and Japanese Patent Application No. 2005-195747 filed Jul. 5, 2005, No. 2005-299599 filed Oct. 14, 2005 and No. 2006-013554 filed Jan. 23, 2006 pursuant to 35 U.S.C. §111(b).

TECHNICAL FIELD

This invention relates to a light-emitting diode excelling in electrostatic breakdown voltage and particularly relates to a light-emitting diode of high luminance, a method for the fabrication thereof, and a lamp.

BACKGROUND ART

Heretofore, with the object of improving light-emitting diodes in electrostatic breakdown voltage, a large number of methods directed toward improving an LED in breakdown voltage against static electricity by having an electronic part, such as a Zener diode, connected to the LED have been reduced to practice. Particularly, as regards the gallium nitride (GaN)-based LED and the aluminum-gallium-indium phosphide (AlGaInP)-based LED which are formed by using thin compound semiconductor layers, JP-A 2005-20038, for example, discloses an LED that is expected to acquire an enhanced electrostatic breakdown voltage by deliberately having a Zener diode added to and incorporated in the circuit thereof.

Besides, in JP-A 2005-57228 and JP-A 2000-188425, a technique for enhancing the electrostatic breakdown voltage of an LED by causing the LED to be provided with a power supply circuit having capacitors and resistors incorporated in a complicated manner therein is disclosed. The conventional technique, however, necessitates connection of electronic parts, such as a Zener diode and a capacitor to the power supply circuit so as to intend to impart enhanced electrostatic breakdown voltage of the LED. This necessity entails a problem that the LED is unduly enlarged for the sake of securing a space for the installation of the electronic parts. Then, an attempt to increase the number of such electronic parts to be incorporated in the power supply circuit for the purpose of enhancing the electrostatic breakdown voltage to a still better degree entails a problem that the technique for assembling circuits will become complicated and the cost for the fabrication of the LED will inevitably rise.

Besides, a technique for enhancing the breakdown voltage relative to the reverse voltage of an LED by disposing a p-n junction-type LED and a p-n junction-type protective diode separated from the LED and electrically connecting them in a parallel pattern is disclosed in JP-A SHO 52-61982. Also a method which renders an LED difficult to break even on exposure to a reverse voltage by disposing independent p-n junction-type protective diodes adjacently on the same substrate besides following the aforementioned technique of disposing the p-n junction-type protective diode as a simple unit separated from the LED is disclosed in JP-A HEI 10-200159.

The conventional technique which seeks to enhance the reverse voltage of an LED by using a protective diode as a simple component and electrically connecting the relevant components in a parallel pattern as described above, however, necessitates a space for disposing the protective diode and suffers the consequently formed LED to enlarge automatically in chip size. The protective diode disposed as separated from the LED for the purpose of manifesting the function of protecting the LED from the overvoltage in the reverse direction necessitates an electrode for operating the protective diode itself in addition to an electrode for establishing flow of an operating current to the light-emitting part of the LED. The LED that causes the simple p-n junction-type protective diodes disclosed in JP-A SHO 52-61982 to be disposed adjacently, for example, is required to form a total of three (refer to FIG. 4 of the drawings of JP-A SHO 52-61982) or still more a total of four (refer to FIG. 1 of the drawings of JP-A SHO 52-61982) input and output electrodes. This undeniably renders the process for fabricating the LED complicated.

Meanwhile, in the case of the AlGaInP-based compound semiconductor light-emitting device, for example, a method that consists in removing a nontransparent GaAs substrate used in growing an AlGaInP crystal and bonding a transparent GaP substrate with the object of efficiently extracting the emitted light from the device has been developed as disclosed in Japanese Patent No. 3230638 and JP-A 2001-57441.

When the GaP substrate to be used in the light-emitting device of high luminance mentioned above is made to assume the surface of (100) or a surface inclined within 20° from the (100) in the direction of <011>, there ensues a problem that the substrate having a thickness of 100 to 150 μm will suffer from weak mechanical strength and the process of production thereof will incur a decrease in the yield of production due to "cracking."

If the thickness of the GaP substrate is made to exceed 200 μm with a view to securing mechanical strength, though the decrease of yield due to "cracking" can be diminished, the excess will nevertheless induce such problems as rendering difficult the escape of heat from the interior of the chip, lowering the luminance, and degrading the reliability. The white light-emitting device that is used together with the GaN-based light-emitting device will also suffer the chip height thereof to increase to twice or more the ordinary GaN-based light-emitting device. For this reason, the package thereof together with the GaN-based light-emitting device will incur inconvenience.

As one of the methods available for bonding a transparent substrate such as GaP, for example, a method which effects the bonding through a transparent adhesive material has been developed as disclosed in JP-A 2002-158373.

When the epitaxial layer is exposed as expected by removing a light absorbing substrate which is a grown substrate and further removing partly an LED epitaxial layer as taught in JP-A 2002-158373, however, there ensue such problems concerning assemblage as deteriorating the state of the surface exposed by the etching, degrading the state of the surface of an electrode formed on the surface, and consequently inducing inferior optical recognition. The automatically operated wire bonding device, chip sorter, etc. are required to position pertinent electrodes by optically recognizing them as with a CCD camera. If the electrodes have a coarse surface, the metallic reflection necessary for the optical recognition will fail and this failure will render the recognition inferior. This failure is ascribed to the following reason.

As the substrate to be used for epitaxial growth during the fabrication of an AlGaInP-based compound semiconductor light-emitting device, a substrate having the surface orientation of crystal inclined to the <011> direction from the (100) is used because it is capable of enhancing the crystal quality of an epitaxial growth layer. The common knowledge dictates the theory that the direction of this inclination consists in causing the surface orientation to express the (111)A face from the (100) as proposed in Jpn. J. Appl. Phys., H. Sugawara et al., 31 (1992) 2446. When the surface orientation of crystal of the compound semiconductor possessing such a zinc blende structure as exhibited by GaP or GaAs is to be inclined, the direction of expressing the (111)A face and the direction of expressing the (111)B face are conceivable, depending on the direction in which the crystal axis is inclined from the (100). The (111)A face is the face in which Ga as a Group III element appears predominantly to the surface and the (111)B face is the face in which P or As as a Group V element appears predominantly to the surface. In the substrate having the plane direction of crystal inclined from the (100) toward the <011> direction, the (111)A face constitutes a predominant face on the front surface side and the (111)B face constitutes a predominant face on the back surface side.

When the structure disclosed in JP-A 2002-158373 is adopted, the surface of the epitaxial layer exposed by etching constitutes the back surface relative to the direction of growth. Alternatively mentioned, when the light-emitting part and the ohmic contact epitaxial layer are formed by using a substrate having the surface orientation of crystal inclined from the (100) toward the <011> direction, the (111)B face predominantly constitutes itself the surface of the epitaxial layer to be exposed. Since the (111)B face is characterized by forming a coarse surface in consequence of etching, the exposed surface of the epitaxial layer is inevitably coarsened and is suffered to entail the problem of optical recognition described above.

An object of this invention initiated in view of the problems confronting the conventional techniques as mentioned above is to provide an LED that is enabled to abound in luminance, excel in electrostatic breakdown voltage and assume a small size by causing protecting functions for opposing overvoltage to be contained in the same chip without requiring deliberate attachment of a circuit having electronic parts, such as condensers and resistors, mounted thereon for the sake of improving electrostatic breakdown voltage, a method capable of fabricating the LED inexpensively, and a lamp making use of the LED.

Another object of this invention is to provide an LED that is enabled to attain an excellent electrostatic breakdown voltage by being endowed with a simple structure containing protective functions opposing overvoltage in the interior of a simple LED instead of having such simple electronic parts as protective diodes disposed anew adjacently as separated from the LED and by only fulfilling the necessity for ordinary two electrodes, one positive and the other negative in polarity, necessary at least for operating the LED without adding to the number of electrodes (in other words, number of wire connections), a method of formation capable of fabrocating the LED inexpensively, and a lamp making use of the LED.

Still another object of this invention is to provide an AlGaInP-based light-emitting device that is enabled to abound in luminance and excel in the heat radiating property by lowering the chip height of the light-emitting device till it approximates closely to that of a GaN-based light-emitting device without lowering the yield of process.

Yet another object of this invention is to provide a light-emitting device that is enabled to abound in luminance and promote stabilization of the yield by properly selecting the plane direction of crystal of a substrate for growing a light-emitting layer and consequently allowing amendment of the coarsening caused on the ohmic contact forming surface by an etching process.

DISCLOSURE OF THE INVENTION

To be specific, this invention has been perfected with a view to accomplishing the objects mentioned above and consists of the following embodiments.

The first aspect of the invention provides a light-emitting diode comprising a compound semiconductor layer including a p-n junction-type light-emitting part, an electric conductor disposed on the compound semiconductor layer and formed of an electrically conductive material optically transparent to light emitted from the light-emitting part and a high resistance layer possessing higher resistance than the electric conductor and provided in a middle between the compound semiconductor layer and the electric conductor.

In a light-emitting diode of the second aspect of the invention that includes the first aspect, the high resistance layer is disposed as bonded to the electric conductor.

In a light-emitting diode of the third aspect of the invention that includes the first or second aspect, the high resistance layer is formed of an amorphous material or a polycrystalline material containing an amorphous substance and has a thickness of 0.5 nm or more and 10 nm or less.

In a light-emitting diode of the fourth aspect of the invention that includes the third aspect, the amorphous material or the polycrystalline material containing an amorphous substance is formed by irradiating a region of a surface side of the compound semiconductor layer bonded to the electric conductor or a surface side of the electric conductor bonded to the compound semiconductor layer or both surface sides with an ion beam or a neutral beam.

In a light-emitting diode of the fifth aspect of the invention that includes any one of the first to fourth aspects, the high resistance layer is formed of a compound semiconductor material having a carrier concentration of $5\times10^{18}$ $cm^{-3}$ or less.

A light-emitting diode of the sixth aspect of the invention that includes any one of the first to fifth aspects further comprises a second compound semiconductor layer of a type of conductivity opposite to the electric conductor, which layer is bonded to a surface of the high resistance layer opposite to a side thereof bonded to the electric conductor.

In a light-emitting diode of the seventh aspect of the invention that includes the sixth aspect, the second compound semiconductor layer is formed of gallium phosphide (GaP).

In a light-emitting diode of the eighth aspect of the invention that includes the sixth or seventh aspect, the second compound semiconductor layer has a thickness of 5 μm or more and a carrier concentration of $1\times10^{17}$ $cm^{-3}$ or more.

In a light-emitting diode of the ninth aspect of the invention that includes any one of the sixth to eighth aspects, a breakdown voltage of a bond formed of the electric conductor, the high resistance layer and the second compound semiconductor layer during a flow of an electric current of 10 μA exceeds 2 times a forward voltage of the light-emitting diode during a flow of an electric current of 10 μA and smaller than ½ of a reverse voltage of the light-emitting diode during a flow of an electric current of 10 μA.

In a light-emitting diode of the tenth aspect of the invention that includes any one of the first to ninth aspects, the electric conductor is formed of an electrically conductive compound semiconductor material having a thickness of 50 μm or more.

In a light-emitting diode of the eleventh aspect of the invention that includes any one of the first to tenth aspects, the electric conductor is formed of an electrically conductive compound semiconductor material having a thickness of 200 µm or less.

In a light-emitting diode of the twelfth aspect of the invention that includes any one of the first to eleventh aspects, the electric conductor is formed of gallium phosphide (GaP).

In a light-emitting diode of the thirteenth aspect of the invention that includes the twelfth aspect, a surface orientation of the electric conductor formed of GaP falls in the (111) or inclines within 20° from the (111).

In a light-emitting diode of the fourteenth aspect of the invention that includes the twelfth or thirteenth aspect, a reverse face and a lateral face of the electric conductor formed of GaP have formed thereon irregularities having a difference of height of 1 to 10 µm.

In a light-emitting diode of the fifteenth aspect of the invention that includes any one of the twelfth to fourteenth aspects, the second compound semiconductor layer is of a p-type, and the electric conductor is of an n-type and is formed of GaP having Si, S and Te added thereto or retained in an undoped state.

In a light-emitting diode of the sixteenth aspect of the invention that includes any one of the first to fifteenth aspects, the electric conductor has a carrier concentration of $5 \times 10^{18}$ cm$^{-3}$ or less.

A light-emitting diode of the seventeenth aspect of the invention that includes any one of the first to sixteenth aspects further comprises a metal layer formed on a surface of the electric conductor on a side opposite to a side having the light-emitting part disposed thereon.

A light-emitting diode of the eighteenth aspect of the invention that includes any one of the first to sixteenth aspects further comprises a transparent electrically conductive film formed on a surface of the electric conductor on a side opposite to a side having the light-emitting part disposed thereon.

In a light-emitting diode of the nineteenth aspect of the invention that includes any one of the first to eighteenth aspects, the light-emitting part contains a semiconductor layer formed of a material of a composition represented by formula $(Al_XGa_{1-X})_YIn_{1-Y}P$ ($0 \leq X \leq 1$, $0 \leq Y \leq 1$).

A light-emitting diode of the twentieth aspect of the invention that includes any one of the first to nineteenth aspects further comprising an n-type electrode and a p-type electrode formed on opposite sides across the light-emitting part and one of the electrodes falling on an electric conductor side is interposed between the light-emitting part and the electric conductor.

In a light-emitting diode of the twenty-first aspect of the invention that includes any one of the first to twentieth aspects, a surface on which an electrode of an electric conductor side is to be formed is a surface inclined in a direction of expressing the (111)A face to appear from the (100).

A method for the fabrication of a light-emitting diode that includes a compound semiconductor layer containing a p-n junction-type light-emitting part, an electric conductor disposed as bonded on the compound semiconductor layer and formed of an electrically conductive material optically transparent to light emitted from the light-emitting part, and a high resistance layer interposed between the compound semiconductor layer and the electric conductor and possessing higher resistance than the electric conductor, the method comprising the step of irradiating a surface side of the compound semiconductor layer bonded to the electric conductor or a surface side of the electric conductor bonded to the compound semiconductor layer with an ion beam or a neutral beam, thereby forming the high resistance layer.

The twenty-third aspect of the invention provides a light-emitting diode lamp formed utilizing the light-emitting diode according to any one of the first to twenty-first aspects, wherein the electric conductor and an electrode disposed across the light-emitting layer on the compound semiconductor layer falling on a side opposite to the electric conductor have an identical type of conductivity and are electrically connected at an approximately identical electric potential.

The twenty-fourth aspect of the invention provides a light-emitting diode produced by the method for the fabrication of a light-emitting diode according to the twenty-second aspect.

This invention, in an LED provided with a substrate, a light-emitting part of the type of a p-n junction structure disposed on the substrate and formed of a compound semiconductor layer, and an electric conductor disposed on the light-emitting part and formed of an electrically conductive material optically transparent to the light emitted from the light-emitting part, contemplates forming the LED in a structure having included in a single LED chip a bonding structure containing a high resistance layer possessing a higher resistance than the electric conductor disposed in the middle between the light-emitting part and the electric conductor. Since this invention, unlike the conventional technique, obviates the necessity for daring to add electronic parts, such as protective diodes, for the purpose of enhancing the breakdown voltage of the LED in the reverse direction and the necessity for further adding to the electric voltage for the purpose of electrically connecting the LED and the added electronic parts, it can provide an LED that enjoys a simple structure furnished with minimally required positive and negative electrodes for the operation of the LED and excels in the property of breakdown voltage in the reverse direction.

Particularly, since this invention contemplates forming the bonding structure that is included in the single LED chip and intended to enhance the breakdown voltage in the reverse direction with the high resistance layer, the electric conductor bonded on one surface of the high resistance layer, and the compound semiconductor layer of the type of conductivity reverse to the electric conductor disposed as bonded to the surface opposite the surface having bonded thereto the electric conductor, it can provide an LED that obviates the necessity for daring to add electronic parts, such as protective diodes for the purpose of enhancing the breakdown voltage of the LED in the reverse direction and the necessity for further adding to the electric voltage for the purpose of electrically connecting the LED and the added electronic parts, provides a simple structure, and excels in the property of withstanding the pressure accidentally exerted in the reverse direction as by the static electricity.

Then, by causing the breakdown voltage of the bonding structure which is composed of the electric conductor, the high resistance layer, and the compound semiconductor layer of the type of conductivity reverse to the electric conductor with the object of heightening the property of dielectric strength in the reverse direction to be so adjusted as to assume a magnitude in a proper range in view of the forward voltage and the reverse voltage of the LED enclosing the bonding structure, this invention is enabled to provide an LED that excels in the property of withstanding the pressure accidentally exerted in the reverse direction as by the static electricity.

Further, this invention, by causing the electric conductor, the high resistance layer, and the compound semiconductor layer of the type of conductivity reverse to the electric conductor which compose the bond intended to enhance the resistance to the voltage accidentally applied in the reverse direction as by the static electricity to be formed of materials optically transparent to the light emitted from the light-emitting part, is enabled to provide an LED that excels in the resistance to the voltage accidentally applied in the reverse direction, excels in the efficiency of extracting the emitted light to the exterior, and provides high luminance.

Especially, this invention, by forming a transparent conductive coating on the surface of the electric conductor on the side opposite to the side used for disposing the light-emitting part and consequently giving rise to a structure for diffusing the device-operating current throughout a wide range of the light-emitting part, is enabled to enhance the effect of producing an LED that excels in the resistance to the voltage accidentally applied in the reverse direction and abounds in luminance as well.

Particularly, this invention, by forming a metal coating on the surface of the electric conductor on the side opposite to the side used for disposing the light-emitting part and consequently causing the light emitted from the light-emitting part to be reflected in the direction of extraction of the emitted light, is enabled to enhance the effect of producing an LED that excels in the resistance to the voltage accidentally applied in the reverse direction and abounds in luminance as well.

This invention further concerns a method for forming a light-emitting diode by bonding a substrate, a light-emitting part of the type of a p-n junction structure formed of a compound semiconductor layer as disposed on the substrate, and an electric conductor made of an electrically conductive material optically transparent to the light emitted from the light-emitting part and disposed on the light-emitting part and interposing a high resistance layer possessing higher resistance than the electric conductor between the light-emitting part and the electric conductor bonded on the light-emitting part. When the high resistance layer is formed by irradiating the surface of the compound semiconductor layer existing on the side used for bonding the electric conductor formed on the substrate or the surface of the electric conductor existing on the side used for bonding the compound semiconductor layer with a beam of electrically neutral particles or charged particles, this invention is enabled to form easily with high productivity the bonding structure composed of compound semiconductor/high resistance layer/electric conductor and intended to enhance the resistance to the voltage accidentally applied in the reverse direction.

This invention, by causing the light-emitting diode lamp produced by utilizing the light-emitting diode which encloses the bonding structure composed of compound semiconductor/high resistance layer/electric conductor with a view to enhancing the resistance to the voltage accidentally applied in the reverse direction to be formed by electrically connecting the electric conductor and the electrode placed more toward the substrate side than toward the light-emitting layer and disposed on the compound semiconductor layer side assuming the same type of conductivity as the electric conductor, is enabled to form easily the light-emitting diode lamp excelling in the resistance to the voltage accidentally applied in the reverse direction without deliberately adding electronic parts, such as protective diodes, condensers and resistors, separately.

This invention, in an LED provided with a compound semiconductor layer containing a light-emitting layer and a GaP substrate disposed on the light-emitting part and rendered optically transparent to the light emitted from the light-emitting part, is enabled to provide an AlGaInP-based compound semiconductor light-emitting device that is formed in nearly the same height as the GaN-based compound semiconductor light-emitting device without inducing a decrease of yield.

Owing to the use of the GaP substrate which has the surface orientation fall in the (111) or incline within 20° from the (111), this invention is enabled to form irregularities easily in the substrate by wet etching and consequently enhance the efficiency of extraction of the light.

The GaP having the plane direction mentioned above allows the substrate to decrease in thickness because it possesses a great mechanical strength as compared with the GaP having the plane direction in the (100).

In this invention, the thermal resistance between the light-emitting layer and the stem is small because the GaP to be used has a small thickness of 200 μm or less. This invention, therefore, is enabled to provide a compound semiconductor light-emitting device that is capable of suppressing the rise of temperature of the light-emitting layer and stabilizing the operation thereof during the presence of high electric current and high temperature.

Further, this invention is enabled to promote the prevention of the surface condition of the ohmic contact layer from being deteriorated by etching by causing the crystal face of the exposed surface of the ohmic contact layer to constitute a crystal face in which the chemically stable (111)A face predominates, namely by using as the growth substrate a substrate having the plane direction inclined from the face (100) in the <01-1> direction and in the direction of inducing expression of the (111)B face and consequently transforming the surface of the ohmic contact forming layer to be exposed into a face in which the (111)A face predominates. As a result, this invention is enabled to produce a transparent substrate light-emitting diode that abounds in luminance and manifests no appreciable dispersion in a stable yield.

The above and other objects, characteristic features and advantages of the present invention will become apparent to those skilled in the art from the description to be given herein below with reference to the accompanying drawings.

BEST MODE FOR CARRYING OUT THE INVENTION

The light-emitting diode of this invention is provided with a substrate, a compound semiconductor layer containing a p-n junction-type light-emitting part formed on the substrate, and a layer made of a transparent electrically conductive material and disposed on the compound semiconductor layer (hereinafter occasionally referred to as "a transparent electric conductor" or simply as "an electric conductor"). Then, a high resistance layer possessing higher electric resistance than the electric conductor is interposed between the compound semiconductor layer and the transparent electric conductor.

The light-emitting part of the p-n junction-type structure is formed of a composition of the formula $(Al_XGa_{1-X})_YIn_{1-Y}P$ ($0 \leq X \leq 1$, $0 \leq Y \leq 1$), such as gallium phosphide (GaP), aluminum-gallium arsenide (AlGaAs), gallium-indium nitride (GaInN). The light-emitting part may be formed of either a single hetero (SH) or a double hetero (DH) structure. The light-emitting layer provided in the light-emitting part may be formed in a single quantum well (SQW) structure or a multi-quantum well (MQW) structure.

The high resistance layer is formed in the semiconductor layer of the light-emitting part and/or the electric conductor and is disposed fast by bonding the relevant layers.

The high resistance layer possessing higher resistance than the electric conductor and interposed between the light-emitting part and the electric conductor is a layer that creates the function of preventing any electric current other than the electric current for operating the device (device-operating current) from accidentally flowing in an excessive amount to the light-emitting part when the voltage in the reverse direction (reverse voltage) is applied to the light-emitting part. Meanwhile, as regards the device-operating current which is made to flow in the forward direction to the light-emitting part (forward current), the high resistance layer manifests the function of suppressing the leakage of the forward current to the electric conductor and making the forward current flow normally preferentially to the light-emitting part.

For the purpose of effectively controlling the flow of the electric current possessing such a directional property as mentioned above by means of the direction of this flow, it is advantageous to form a bonded structure which has the high resistance layer disposed as bonded to the electric conductor and as well has the compound semiconductor layer of the type of conductivity reverse to the electric conductor bonded to the surface of the high resistance layer on the side opposite to the side used for bonding with the electric conductor. When intermediate layers possessing such a characteristic property as manifested by a capacitor are bonded one each to the opposite sides of the high resistance layer, they fail to give rise to a bonded structure of a very minute capacity which is convenient for instantaneously blocking an excess current. For the purpose of obtaining the effect of this invention fully stably, it is ideal to form a structure that has an electric conductor and a compound semiconductor directly bonded to the opposite surface sides of a high resistance layer.

As concrete examples of the compound semiconductor layer to be bonded to the high resistance layer, a clad layer forming a light-emitting part, a window layer disposed on the light-emitting part and adapted to permit efficient transmission of the light emitted from the light-emitting part to the exterior, and a contact layer disposed on the light-emitting part and adapted to facilitate the bonding with the electric conductor may be cited. When the compound semiconductor layer to be bonded to the high resistance layer happens to be an n-type compound semiconductor layer which is disposed on a p-n junction-type light-emitting part formed on a p-type gallium arsenide (GaAs) single crystal substrate, for example, the electric conductor to be bonded to the opposite side of the high resistance layer is selected from among such materials as manifest p-type conductivity.

The compound semiconductor layer is preferably a conductive layer formed of a material optically transparent to the light emitted from the light-emitting part. It can be formed of aluminum-gallium arsenide (AlGaAs) or gallium phosphide (GaP), for example, GaP being preferable. Advantageously, the compound semiconductor layer has a thickness of 5 μm or more and a carrier concentration of $1\times10^{17}$ cm$^{-3}$ or more.

Regardless of the type of conductivity of the compound semiconductor layers to be bonded one each to the opposite sides of the high resistance layer, the high resistance layer may be formed of a layer of either a p-type or an n-type of conductivity. In short, it is permissible to form the p-n junction between the high resistance layer and the compound semiconductor layer bonded thereto or between the high resistance layer and the electric conductor.

The high resistance layer can be formed of a semiconductor material, an organic or inorganic insulating thin-film material, a metal oxide material or the like. The high resistance layer can be formed of a film of the material mentioned above or a multiplayer film obtained by multiply stacking such monolayers. Though the crystal form to be assumed by the material forming the high resistance layer may be amorphous, polycrystalline or monocrystalline, this invention prefers that the high resistance layer should either have a thickness of 0.5 nm or more and 10 nm or less or be formed of an amorphous material or a polycrystalline material containing an amorphous substance. This is because the distortion caused by deviation of the direction of bonding is relaxed and the bond excelling in adhesiveness is accomplished by forming the high resistance layer of an amorphous material or a polycrystalline material containing an amorphous substance prior to bonding the electric conductor contemplated by this invention to the high resistance layer. It is particularly advantageous to form the high resistance layer by using a compound semiconductor material, such as GaP, for example, which has a carrier concentration of $5\times10^{18}$ cm$^{-3}$ or less. The carrier concentration that leads to stabilizing conductivity is preferably $5\times10^{15}$ cm$^{-3}$ or more.

The high resistance layer, in forming the compound semiconductor layer/high resistance layer/electric conductor structure, is preferred to be a resistance layer fulfilling a relation such that the breakdown voltage (V3) during the flow of electric current of 10 μA exceeds two times the forward voltage (V1) of the light-emitting diode provided with the p-n junction structure-type light-emitting part during the flow of an electric current of 10 μA and falls short of ½ of the reverse voltage (V2) of the light-emitting diode mentioned above during the flow of an electric current of 10 μA. That is, the resistance layer preferably fulfills this numerical relation 0.5·V2>V3>2.0·V1. More preferably, the high resistance layer is a resistance layer that gives a breakdown voltage ("Semiconductor Engineering," compiled by Toyoji Fukami and published on Mar. 20, 1993 by Tokyo Denki Daigaku Publishing Bureau; refer to pages 78-80, seventh print, first edition) which satisfies a relation of 0.3·V2>V3>3.0·V1.

The high resistance layer that conveniently induces the breakdown voltage fulfilling the relation mentioned above can be formed, for example, by the MetalOrganic Chemical Vapor Deposition (MOCVD) method, the halogen Vapor Phase Epitaxial (VPE) method, the hydride VPE method or the Molecular Beam Epitaxial (MBD) method. Particularly, the MOCVD method in common use for the growth of a compound semiconductor thin film that uses phosphorus (P) as a component element is advantageously used for the growth of the high resistance layer. As one means for forming a high resistance layer capable of giving an expected voltage drop, the so-called doping means that consists in deliberately adding a p-type impurity or an n-type impurity during the growth of a high resistance layer may be cited. As the impurity to be added, the same dopant as used during the formation of an n-type or a p-type layer forming the light-emitting part or a dopant having a small diffusion coefficient is effective.

The high resistance layer can be formed by irradiating the surface of the semiconductor layer to which the electric conductor of this invention is to be bonded with ions, protons (H$^+$) or electrons of an element and consequently causing the surface region of the semiconductor layer to assume an amorphous texture or a polycrystalline texture containing an amorphous texture. It can be otherwise formed by irradiating the surface with an electrically neutral radical (excited atoms)

and consequently causing the surface region of the semiconductor layer to assume an amorphous texture or a polycrystalline texture containing an amorphous texture. If ions or radicals of an element having an extremely large mass number are used for the irradiation, they will enlarge the damage inflicted on the semiconductor layer possibly to the extent of breaking the semiconductor layer roughly in a total of more than 10 nm in depth and will consequently induce a disadvantage of preventing the amorphous region or the polycrystalline region containing an amorphous region from being stably formed in an agreeable thickness. As concrete examples of the element or the ion source preferably used for the irradiation, nitrogen ion, helium (He) ion, neon (Ne) ion and argon (Ar) ion may be cited. As concrete examples of the agreeable radical source, nitrogen radical and argon radical may be cited. The high resistance layer may be formed on the electric conductor by the same method as described above.

This invention contemplates a structure in which an electric conductor optically transparent to the light emitted from the light-emitting layer is bonded to the high resistance layer. As a result, a visible LED of high luminance is produced. As concrete examples of the optically transparent material that is capable of transmitting the light emitted from the light-emitting layer $(Al_XGa_{1-X})_YIn_{1-Y}P$ ($0 \leq X \leq 1$, $0 \leq Y \leq 1$) to the exterior, compound semiconductor materials, such as GaP, cubic or hexagonal silicon carbide (SiC), aluminum-gallium arsenide (AlGaAs), gallium nitride (GaN), aluminum nitride (AlN), zinc selenide (ZnSe), zinc sulfide (ZnS) and AlGaInP may be cited. Among other examples mentioned above, GaP proves particularly preferable.

Particularly, the GaP crystal proves to be a hopeful material for forming the electric conductor because it possesses an approximately equal thermal expansion coefficient as the $(Al_XGa_{1-X})_YIn_{1-Y}P$ ($0 \leq X \leq 1$, $0 \leq Y \leq 1$) that forms the light-emitting part, for example, because it is easily grown epitaxially on the light-emitting part and because this crystal of the thickness mentioned above is being commercially produced as a bulk crystal. When the electric conductor, in respect of the $(Al_XGa_{1-X})_YIn_{1-Y}P$ ($0 \leq x \leq 1$, $0 \leq Y \leq 1$) light-emitting layer capable of emitting a visible light in yellow green to red color, is formed of such GaP as permits transmission of an emitted light in this zone, therefore, it can contribute to fabricating easily and inexpensively a visible LED having enhanced the efficiency of extraction of the emitted light to the exterior and consequently abounding in luminance.

The electric conductor to be bonded to the high resistance layer preferably measures not less than 50 μm in thickness from the viewpoint of enabling the pertinent device to maintain mechanical strength.

The GaP possesses greater mechanical strength when the surface orientation thereof falls in the face (111) than when it falls in the face (100) and the substrate of this GaP, therefore, enables its thickness to decrease to below 200 μm, preferably below 150 μm.

The GaP substrate is usable in either the n-type or the p-type. Preferably, the n-type GaP doped with Si, S and Te or remains in an undoped state and possesses a carrier concentration of $1 \times 10^{18}$ cm$^{-3}$ or less with a view to suppressing the internal resorption of the light generated in the light-emitting layer and consequently enhancing the efficiency of extraction of light.

Further, the GaP substrate preferably has irregularities of about 1 to 10 μm in difference of height formed on the back face and the lateral face thereof.

The high resistance layer and the electric conductor are simply bonded by thermo depression bonding either directly or through an adhesive agent, for example. The conventional bonding methods, such as the charged beam bonding method and the neutral beam bonding method, are also available for this bonding. The argon or nitrogen neutral beam method, for example, is utilized for carrying out the bonding. Particularly, the technique that directly bonds the two layers at ordinary temperature (room temperature) without using an inclusion, such as adhesive agent, for the sake of adhesion can constitute an advantageous bonding means because it is capable of preventing heat shock from reaching the light-emitting part (refer to Appl. Phys. Lett., Vol. 72, No. 13 (1998), pp. 1565-1566). Further, it can form a bond excelling in adhesive strength because it is capable of avoiding uncalled-for accumulation of impurities, such as carbon (C) impurity and oxygen (O) impurity due to the contamination of the bonded surface with an inclusion.

In this invention, a metal layer capable of reflecting the light emitted from the light-emitting layer can be provided on the surface of the electric conductor on the side opposite to the side used for bonding the semiconductor layer, namely the surface of the electric conductor on the side opposite to the side used for disposing the light-emitting part. This provision allows production of an LED abounding in luminance. The metal layer can be preferably formed of a monolayer film made of a metal, such as aluminum (Al), gold (Au) or silver (Ag) that exhibits high reflectance to a visible light or a multilayer film resulting from multiply stacking many films of different metals.

The metal layer possessing the function of reflecting the emitted light in the direction of extraction thereof, when used in fixing (mounting) an LED on a supporting jig, such as a stem, and completing an LED lamp, proves usable for enhancing the continuity between the supporting jig and the electric conductor. When the surface area of the metal film of good conductivity to be disposed on the surface of the electric conductor on the side used for fixing the conductor to the supporting jig is increased, since this increase adds to the points of electric continuity between the supporting jig and the electric conductor, the density of the reverse current flowing to the electric conductor can be decreased even if a reverse voltage is accidentally applied. As a result, it is made possible to produce an LED exhibiting an enhanced protective function to cope with excess current and excelling in breakdown voltage to withstand the voltage accidentally applied in the reverse direction.

A transparent conductive film can be formed on the surface of the electric conductor on the side opposite to the surface used for bonding the semiconductor layer. This transparent conductive film establishes continuity between the electric conductor and the supporting jig. The transparent conductive film can be preferably formed of a transparent conductive film, such as indium-tin complex oxide film (ITO), zinc oxide (ZnO) or aluminum-copper oxide film, that avoids impairing the efficiency of extraction of the emitted light to the exterior and exhibits high permeability to the emitted light from the light-emitting layer. It is reasonable that the transparent conductive film to be provided on the surface of the high resistance layer should be formed of a material coinciding with the type of conductivity of the high resistance layer. The transparent conductive film can be formed, for example, by the publicly known means, such as the common high-frequency sputtering method, or the sol-gel method.

In the LED according to this invention, the electric conductor and the semiconductor layer that are disposed across the high resistance layer possess mutually reverse types of conduction. When the semiconductor layer bonded to the surface of the high resistance layer on the light-emitting part side is formed of a material manifesting n-type conduction, the electric conductor bonded to the other surface of the high resistance layer is formed of a p-type material. Conversely, when the semiconductor layer bonded to the high resistance layer on the light-emitting part side is formed of a p-type GaP, for example, which manifests the p-type conduction, the electric conductor bonded to the other surface of the high resistance layer is formed of an n-type GaP, for example. In short, the stacked structure of the p-type layer of the outermost surface layer of the light-emitting part (or the p-type layer disposed on the light-emitting layer)/high resistance layer/n-type electric conductor (the mark/denotes a bond) or the n-type layer of the outermost surface layer of the light-emitting part (or the n-type layer disposed on the light-emitting layer)/high resistance layer/p-type electric conductor is aimed at. By forming this structure, it is made possible to heighten the magnitude of resistance of the high resistance layer.

By forming the stacked structure that results from combining types of conduction as mentioned in the preceding paragraph, it is made possible to produce the LED which excels in the breakdown voltage for resisting the voltage accidentally applied in the reverse direction. Particularly, when the electric conductor is formed of a GaP crystal having a carrier concentration of $5 \times 10^{18}$ cm$^{-3}$ or less, preferably $1 \times 10^{18}$ cm$^{-3}$ or less, the LED unexpectedly excelling in the breakdown voltage in the reverse direction can be formed.

In fabricating an LED lamp utilizing the LED possessing the excellent breakdown voltage for resisting the voltage accidentally applied in the reverse direction as contemplated by this invention, when the electric conductor forming the bond structure manifesting the excellent breakdown voltage and the electrode of either positive or negative polarity disposed on the light-emitting part are electrically connected so as to give rise to an equal electric potential or a nearly equal electric potential, the LED lamp consequently produced is capable of manifesting the breakdown voltage fully satisfactorily in the reverse direction. The electric connection of the electric conductor or the metal film disposed on one surface of the electric conductor or the transparent conductive film disposed on one surface of the electric conductor to the electrode of either positive or negative polarity disposed on the light-emitting part in a nearly equal electric potential can be conveniently accomplished, for example, by a method which consists in connecting them with wires to the same terminal of a supporting device.

The bond structure manifesting the excellent breakdown voltage for resisting the voltage accidentally applied in the reverse direction as contemplated by this invention is so formed that the breakdown voltage (namely, the voltage V3) may assume a lower magnitude than the reverse voltage of the p-n junction-type light-emitting part (namely, the voltage V2). As a result, the reverse current that occurs when the voltage is accidentally applied in the reverse direction can be made to escape through the bond structure of low breakdown voltage to the electrode of either positive or negative polarity on the light-emitting part without flowing through the light-emitting part rather than being made to escape through the electrode of the other polarity to the light-emitting part whose p-n bond part has a high reverse voltage. The light-emitting part of the LED, therefore, can avoid the breakdown caused by the accidental flow of an excess current in the reverse direction.

Further, when the wide plane region of the supporting jig maintaining continuity to the electric conductor allows the electric conductor and the electrode of either positive or negative polarity disposed on the light-emitting part to form a nearly equal electric potential, it manifests the effect of making the excess current accidentally generated in the reverse direction to escape more efficiently because the density of the reverse current flowing to the electric conductor can be decreased. That is, by adopting the electric connection described in this invention for the electric conductor forming the bond structure of this invention that is contained in the LED, it is made possible to provide an LED lamp excelling in the breakdown voltage for resisting the voltage accidentally applied in the reverse direction without requiring the LED to be deliberately provided with electronic parts, such as a protective diode, condenser and resistor which have been indispensable heretofore.

The electrodes are ohmic electrodes and are disposed one each on the opposite sides of the light-emitting part. In this case, one of the electrodes is interposed between the electric conductor and the high resistance layer. When an n-type buffer layer, an n-type clad layer, a window layer, an n-type semiconductor layer like an n-type contact layer, a light-emitting layer and a p-type semiconductor layer are stacked on the substrate, for example, the n-type ohmic electrode is disposed as kept in contact with the n-type semiconductor layer like an n-type contact layer. When a Bragg reflection layer is incorporated in the structure, this electrode is disposed as kept in contact therewith. The p-type ohmic electrode is disposed in a p-type layer that is kept in contact with the high resistance layer. In this case, the type of conductivity of the electric conductor is the same as the n-type ohmic electrode, namely the n-type conduction. The n-type ohmic electrode may be substituted with a pad electrode which is formed of an ohmic metal film disposed on the surface of a semiconductor layer for the purpose of providing a bonding that forms an electric potential nearly equally to the electric conductor.

When the surface of the p-type electrode-forming layer is formed of a GaP possessing a crystal face in which the (111)A face is expressed predominantly, it is enabled to assume a favorable face condition because it becomes difficult to coarsen.

The electrode can be formed of the pad electrode and an electrode that is adapted to maintain continuity to the pad electrode and remain in an extended state on the surface thereof. When the electrode intended to assume the extended state is formed of an ohmic metal film, the pad electrode does not always need to be formed of a metal film assuming an ohmic contact with the semiconductor layer. When the electrode is formed of the pad electrode and the extended electrode, it is always necessary that the pad electrode and the extended electrode should form a structure establishing electric continuity between them regardless of the presence or absence of an ohmic contact in the semiconductor layer of the pad electrode. The extended ohmic electrode can be formed of an ohmic metal film fabricated in the shape of a lattice, a network, a concentric circle or a frame as by using the photolithographic technique.

The other electrode which forms a pair with the electrode retained in a nearly equal electric potential with the electric conductor and assumes polarity reverse to the electric conductor can be disposed as kept in contact with the semiconductor layer forming the stacked structure used for the LED that is disposed on the substrate. Particularly, when the substrate made of a material possessing a band gap smaller than the width of a forbidden band corresponding to the wavelength of the light emitted from the light-emitting part, such as of GaAs, is used, the LED abounding in luminance can be obtained by removing the substrate which inevitably absorbs the emitted light. This other electrode is advantageously disposed on the semiconductor layer possessing a large band gap exceeding the width of the forbidden band corresponding to the wavelength of the emitted light. It is provided, for example, on the surface of a clad layer or a superlattice buffer layer made of a semiconductor material having a large width of forbidden band

EXAMPLE 1

This example specifically explains an example of fabricating a light-emitting diode contemplated by this invention.

Figure 1:
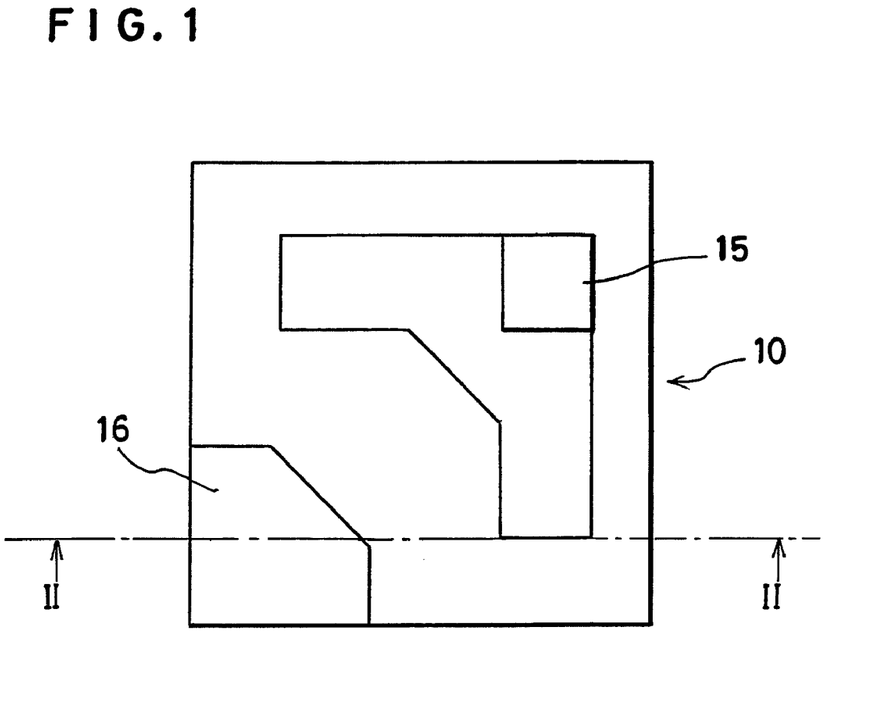
FIG. 1 is a plan view illustrating one example of the light-emitting diode of this invention.
Figure 2:
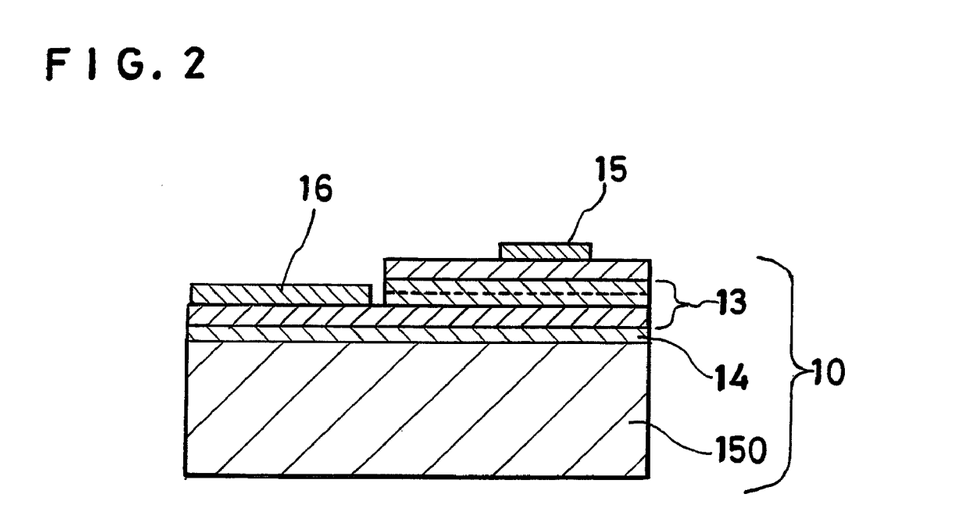
FIG. 2 is a cross section depicting the light-emitting diode of this invention taken through FIG. 1 along line II-II.
Figure 3:
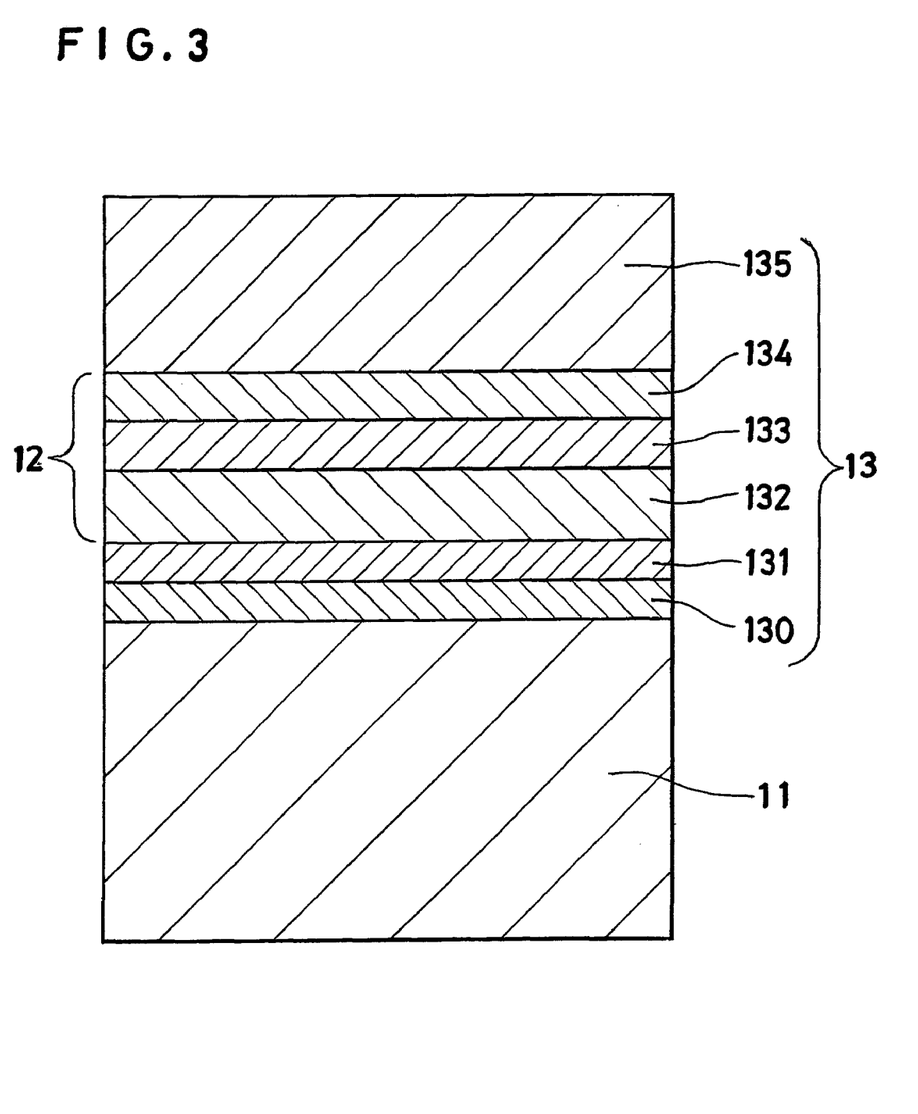
FIG. 3 is a cross section of an epitaxial wafer relating to the light-emitting diode of this invention.

FIG. 1 and FIG. 2 are diagrams illustrating a semiconductor light-emitting diode that was fabricated in the present example; FIG. 1 representing a plan view thereof and FIG. 2 a cross section taken through FIG. 1 along line II-II. FIG. 3 is a cross section of the layer structure of a semiconductor epitaxial wafer used for the semiconductor diode.

A semiconductor light-emitting diode 10 fabricated in the present example was a red light-emitting diode (LED) possessing an AlGaInP light-emitting part.

In this LED, on a semiconductor substrate 11 formed of an Si-doped n-type GaAs single crystal possessing a surface inclined by 15° from the (100), there is formed a semiconductor layer 13 resulting from sequentially stacking a buffer layer 130 formed of a Te-doped n-type GaAs, a contact layer 131 formed of a Te-doped n-type $(Al_{0.5}Ga_{0.5})_{0.5}In_{0.5}P$, a lower clad layer 132 formed of a Te-doped n-type $(Al_{0.7}Ga_{0.3})_{0.5}In_{0.5}P$, a light-emitting layer 133 of the MQW structure formed of 20 pairs of undoped $(Al_{0.2}Ga_{0.8})_{0.5}In_{0.5}P$ and $(Al_{0.7}Ga_{0.3})_{0.5}In_{0.5}P$, an intermediate layer 134 composed of an upper clad layer formed of an Mg-doped p-type $(Al_{0.7}Ga_{0.3})_{0.5}In_{0.5}P$ and a thin film of $(Al_{0.5}Ga_{0.5})_{0.5}In_{0.5}P$, and an Mg-doped p-type GaP layer 135. The light-emitting part 12 of this LED was in a light-emitting structure composed of the lower clad layer 132, the light-emitting layer 133 and the upper clad layer+the intermediate layer 134.

In the present example, an epitaxial wafer illustrated in FIG. 3 was formed by individually stacking the semiconductor layers 130 to 135 on the GaAs substrate 11 in accordance with the reduced-pressure MetalOrganic Chemical Vapor Deposition method (MOCVD method) using trimethyl aluminum, trimethyl gallium and trimethyl indium as the raw materials for the Group III elements. As the raw material for Mg doping, biscyclopentadiethyl Mg was used. As the raw material for Te doping, dimethyl Te was used. As the raw material for the Group V element, phosphine or arsine was used. By the MOCVD method, the component layers of the semiconductor layer 13 were grown at 730° C. and the GaP layer was grown at 750° C.

The GaAs buffer layer 130 had a carrier concentration of about $5 \times 10^{18}$ $cm^{-3}$ and a layer thickness of about 0.2 µm. The contact layer 131 had a carrier concentration of about $2 \times 10^{18}$ $cm^{-3}$ and a layer thickness of about 1.5 µm. The n-clad layer 132 had a carrier concentration of about $8 \times 10^{17}$ $cm^{-3}$ and a layer thickness of about 1 µm. The light-emitting layer 133 had an undoped composition and a layer thickness of 0.8 µm. The p-clad layer 134 had a carrier concentration of about $2 \times 10^{17}$ $cm^{-3}$ and a layer thickness of 1 µm. The GaP layer 135 had a carrier concentration of about $3 \times 10^{18}$ $cm^{-3}$ and a layer thickness of 9 µm.

Thereafter, the epitaxial growth surface was mirror-polished in about 1 µm till a surface roughness of 0.12 nm Next, a GaP electric conductor 150 was used as a transparent electric conductor. The GaP electric conductor was an n-type GaP single crystal doped with S (sulfur) to about $1 \times 10^{18}$ $cm^{-3}$ and had a surface inclined by 5 degrees from the (100). The electric conductor measured 51 mm in diameter and 250 µm in thickness.

The surface of the GaP substrate was mirror-polished till a surface roughness (rms) of 0.12 nm.

A mounting device, subsequent to having the GaP electric conductor 150 and the epitaxial wafer of FIG. 3 set therein, was evacuated till a vacuum degree of $3 \times 10^{-5}$ Pa. Thereafter, Ar gas was ionized and accelerated to energy of 1 keV. Then, the ionized Ar gas was transformed into an Ar beam by being neutralized with electrons. The mirror-polished transparent electric conductor and the epitaxial wafer were irradiated with the beam for 2 minutes to free their surfaces of contamination and activate the surfaces.

After the irradiation, they were piled up in situ in the vacuum and mutually bonded in the vacuum at room temperature under a load adjusted to produce a pressure of 10 $g/cm^2$. The bonded wafer is shown in detail in FIG. 4.

Figure 4:
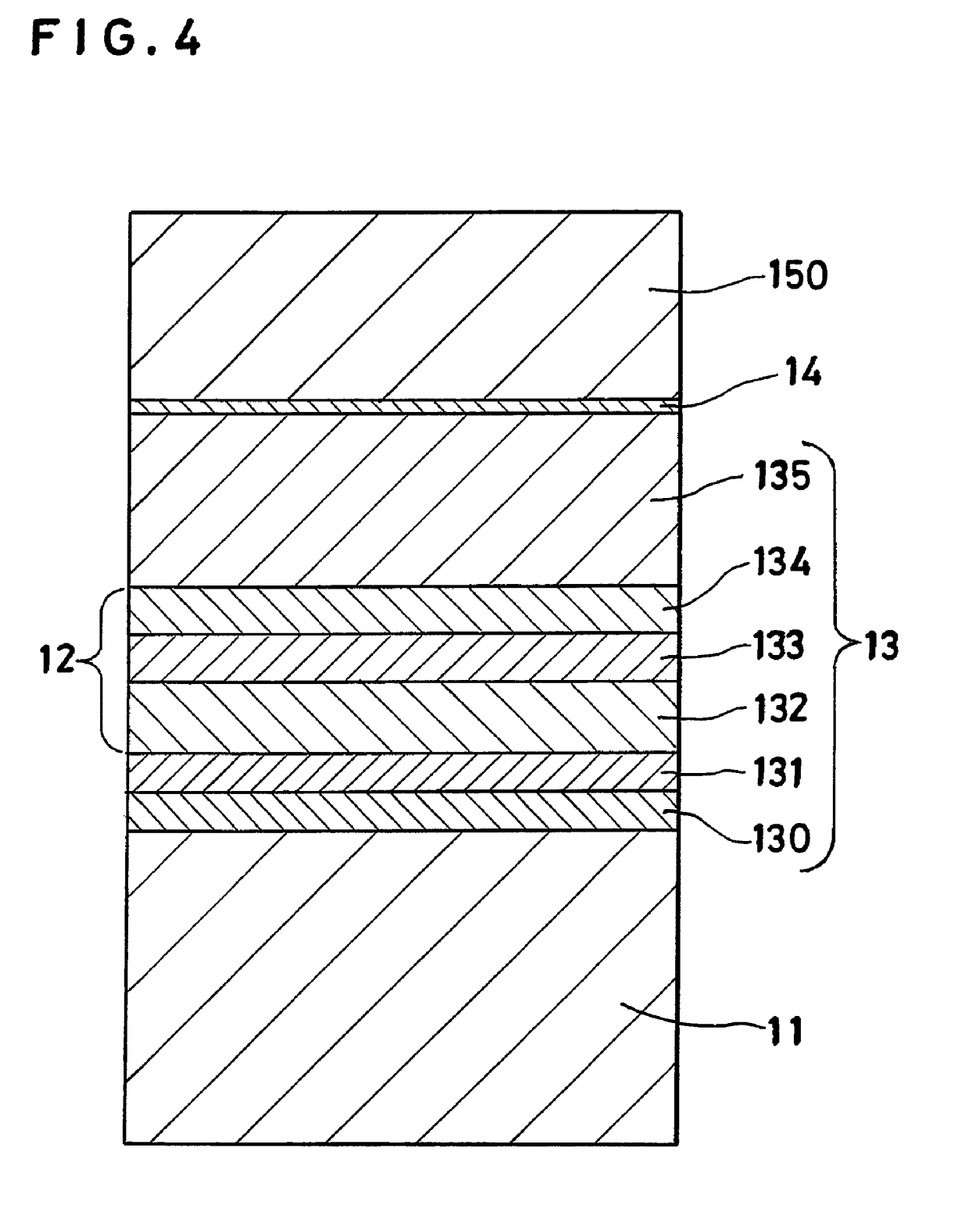
FIG. 4 is a cross section of the light-emitting diode of this invention.

When the interface of this bonding was analyzed, an amorphous layer (high resistance layer) 14 having a thickness of 3 mm was observed in the interface.

Then, from the bonded wafer, the GaAs substrate 11 and the GaAs buffer layer 130 were selectively removed with an ammonia-based etchant.

On the surface of the contact layer 131, an AuGe—Ni alloy, Pt and Au were deposited in respective thicknesses of 0.2 µm, 0.2 µm and 1 µm by the vacuum deposition method to form an n-type ohmic electrode as a first ohmic electrode 15. The n-type ohmic electrode was subjected to patterning by using an ordinary photolithography means to form the electrode 15.

Then, the epitaxial layers 131 to 134 in the region forming the p-electrode were selectively removed to expose the GaP layer 135. On the surface of the GaP layer, AuBe, Pt and Au were deposited in respective thicknesses of 0.2 µm, 0.2 µm and 1 µm by the vacuum deposition method to form a p-type ohmic layer 16.

These electrodes were alloyed by being heat-treated at 450° C. for 10 minutes to form p-type and n-type ohmic electrodes having low resistance.

The wafer consequently obtained was transformed into chips by being cut at intervals of 350 µm by the use of a dicing saw. The damaged layer produced by the dicing and the polluting matter were removed from the chip by etching with a mixed sulfuric acid and hydrogen peroxide liquid to fabricate a semiconductor light-emitting diode (chips) possessing an amorphous layer (high resistance layer) shown in FIG. 1 and FIG. 2. As regards the electrical characteristics of the chip, the forward voltage ($V_f$ at 20 mA) produced during the flow of an electric current of 20 mA in the forward direction was about 2.1 V, a fact that reflected the good ohmic characteristics of the electrodes 15 and 16. The forward voltage V1 of the light-emitting part at 10 µA was about 1.5 V and the reverse voltage V2 thereof at 10 µA was about 40 V.

Figure 5:
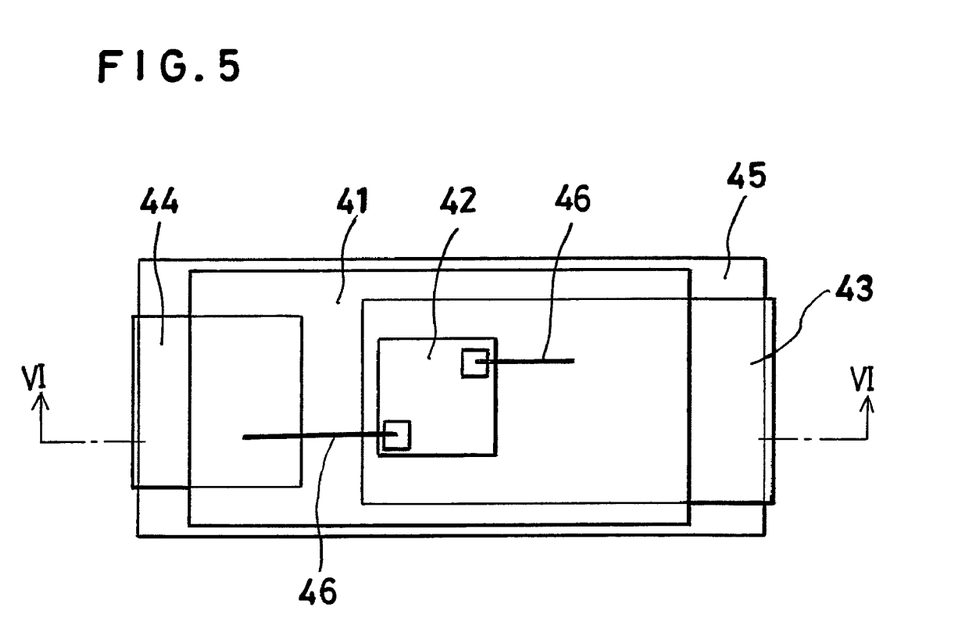
FIG. 5 is a plan view of a light-emitting diode lamp of this invention.
Figure 6:
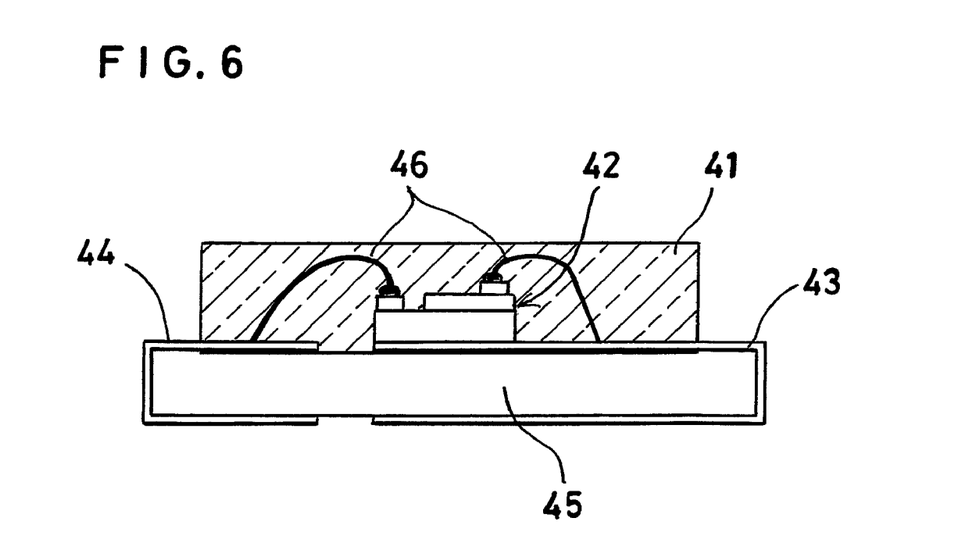
FIG. 6 is a cross-sectional perspective view depicting the light-emitting diode lamp of FIG. 5.

A light-emitting diode chip 42 fabricated as described above was mounted with Ag paste on an electrode terminal 43 as illustrated in FIG. 5 and FIG. 6 and the n-electrode 15 and the electrode terminal 43 were interconnected with a gold wire 46. As a result, the reverse face of the chip and the n-electrode 15 were made to assume an electrically equal potential. Meanwhile, the p-type electrode 16 was connected to another electrode terminal 44 with the gold wire 46. A light-emitting diode was fabricated by being molded with an epoxy resin 41.

When an electric current was made to flow to the p-electrode terminal 44 and the n-electrode terminal 43, a light in red color having a main wavelength of 620 nm was emitted. The forward voltage ($V_f$ at 20 mA) produced during the flow of an electric current of 20 mA was about 2.1 V, a fact that reflected good ohmic characteristics of the electrodes 15 and 16. The forward voltage V1 (at 10 µA) was about 1.5 V and the reverse voltage V2 (at 10 μA) was about 40 V. The breakdown voltage V3 that reflected the characteristics of the high resistance layer was 12 V. The intensity of light emission at this time was a high luminance of 500 mcd, a fact that reflected the high efficiency manifested by the light-emitting part in emitting the light and the device contrived for enhancing the efficiency of extraction of the light to the exterior Thirty (30) of the lamps consequently obtained were randomly selected as samples and tested for electrostatic breakdown voltage. The results are shown in Table 1.

Under the conditions of 100 pF and 1.5 kΩ, no breakdown of the diode by 5000 V (variation of V1 to 10% or more) was detected. This fact indicates that the light-emitting diodes excelled in electrostatic breakdown voltage.

In this example, the magnitudes V1=1.5 V, V2=40 V and V3=12 V satisfied the relation of $0.5 \times V2 > V3 > 2 \times V1$.

This is because the electric current flowed through the electric conductor 150, the amorphous layer 14 and the p-electrode 16 and no load was exerted on the light-emitting part during the application of the reverse voltage used for the electrostatic test. Though the electric current flowed to the light-emitting part during the application of the forward voltage, the electrostatic breakdown voltage in the forward direction was high and unable to induce breakdown.

When the electric polarity of the present example was reversed, the effects obtained were similar.

EXAMPLE 2

This experiment was performed by following the process of the preceding example while having the electric conductor formed of an n-type SiC having the surface polished to a thickness of 0.1 mm. The amorphous layer had a thickness of about 1 nm.

The resultant device emitted a light in red color having a main wavelength of 620 nm when the electric current was fed to the p-electrode terminal and the n-electrode terminal. The intensity of light emission at this time was such high luminance as 520 mcd. The forward voltage ($V_f$: at 20 mA) during the flow of an electric current of 20 mA in the forward direction was about 2.1 V, a fact that reflected good ohmic characteristics of the electrodes.

In this example, the magnitudes V1=1.5 V, V2=39 V and V3=6 V satisfied the relation of $0.5 \times V2 > V3 > 2 \times V1$.

When 30 of the produced lamps were randomly selected as samples and tested for electrostatic breakdown voltage, none of them sustained any breakdown at 100 pF, 1.5 kΩ and 5000 V.

COMPARATIVE EXAMPLE 1

This experiment was performed by following the process of Example 1 cited above while using sapphire, which is an insulator, having the surface polished to a thickness of 0.08 mm in the place of the electric conductor. No electric current flowed to the high resistance layer because the reverse face of the chip was insulated.

As a result, the breakdown voltage V3 was very high (>100 V) so as to satisfy the relation of $V3 > 0.5 \times V2 > 2 \times V1$ and prevent the protective structure from fulfilling its function. When the electric current was fed to the p-electrode terminal 44 and the n-electrode terminal 43, there ensued emission of a light in red color having a main wavelength of 620 nm. The forward voltage ($V_f$: at 20 mA) during the flow of an electric current of 20 mA in the forward direction was about 2.1 V, a fact that reflected good ohmic characteristics of the electrodes. The forward voltage ($V_f$: at 10 μA) V1 was about 1.5 V and the reverse voltage V2 (at 10 μA) was about 40 V. The intensity of light emission at this time was a high luminance of 490 mcd, a fact that reflected the high efficiency manifested by the light-emitting part in emitting the light and the device contrived for enhancing the efficiency of extraction of the light to the exterior Thirty (30) of the lamps consequently obtained were randomly selected as samples and tested for electrostatic breakdown voltage. The results are shown in Table 1.

Under the conditions of 100 pF and 1.5 kΩ, breakdown of diode by 3000 V (variation of V1 in 10% or more) was detected in five samples.

EXAMPLE 3

This experiment was performed by following the process of Example 1 cited above while having the electric conductor formed of a Zn-doped p-type GaP having a carrier concentration of $9 \times 10^{18}$ cm$^{-3}$. The resultant device, when the electric current was fed to the p-electrode terminal and the n-electrode terminal, emitted a light in red color having a main wavelength of 620 nm. The forward voltage ($V_f$: at 20 mA) during the flow of an electric current of 20 mA in the forward direction was about 2.1 V, a fact that reflected good ohmic characteristics of the electrodes. The forward voltage ($V_f$: at 10 μA) was about 1.5 V and the reverse voltage ($V_r$: at 10 μA) was about 4.5 V. The intensity of light emission at this time was high luminance of 450 mcd. When 30 of the produced lamps were randomly selected as samples and tested for electrostatic breakdown voltage, no breakdown was detected at 100 pF, 1.5 kΩ and 5000 V.

The reverse voltage (V2: at 10 μA) of the light-emitting part was about 38 V.

Since the resistance of the high resistance layer was low, V3 equaled V4.

EXAMPLE 4

This experiment was performed by following the process of Example 1 cited above while changing the conditions for the formation of the high resistance layer. The GaP electric conductor and the epitaxial wafer were mutually bonded by being irradiated with an Ar beam of radiation energy of 7 keV for 20 minutes. The thickness of the high resistance layer (amorphous layer) was 13 nm.

The chip consequently manufactured emitted a light in red color having a main wavelength of 620 nm. The forward voltage ($V_f$: at 20 mA) produced during the flow of an electric current of 20 mA in the forward direction was 2.1 V and the intensity of light emission at this time was 480 mcd. Then, the forward voltage ($V_f$: at 10 μA) was about 1.5 V and the reverse voltage ($F_r$: at 10 μA) was about 35 V. When 30 of the manufactured lamps were randomly selected as samples and tested for electrostatic breakdown voltage, breakdown of diode by 100 pF, 1.5 kΩ and 5000 V was detected in 10 samples.

When the light-emitting part was tested for reverse voltage (V2: at 10 μA), the voltage was found to be about 38 V. This fact may be explained by supposing that the electrostatic breakdown voltage decreased because the relation of $0.5 \times V2 < V3$ was satisfied and the function of protecting the reverse direction was slightly lowered.

TABLE 1

Results of test for electrostatic discharge damage

| | Applied Voltage (V) | | | | |
|---|---|---|---|---|---|
| | 1000 | 2000 | 3000 | 4000 | 5000 |
| Ex. 1 | 0 | 0 | 0 | 0 | 0 |
| Ex. 2 | 0 | 0 | 0 | 0 | 0 |
| Ex. 3 | 0 | 0 | 0 | 0 | 0 |
| Ex. 4 | 0 | 0 | 0 | 0 | 10 |
| Comp. Ex 1 | 0 | 0 | 5 | 18 | 7 |

The numerals in the table represent numbers of diodes sustaining damage (total number of samples=30).
Damage: Change of Vf (10 μA) in 10% or more
Circuit conditions: 100 pF and 1.5 kΩ
Number of applications: ±1

EXAMPLE 5

The semiconductor layer 13 was stacked by following the process of Example 1 cited above while having the n-type layer subjected to Si-doping using disilane ($Si_2H_6$) as a raw material for doping. The carrier concentration of the GaAs buffer layer 130 was about $2 \times 10^{18}$ cm$^{-3}$.

The p-type GaP layer 135 had a region thereof reaching a depth of about 1 μm polished till mirror finish. By the mirror finishing, the surface of the p-type Gap layer 135 was given roughness of 0.18 nm. Meanwhile, the n-type GaP substrate 150 to be bonded to the mirror-finished surface of the p-type GaP layer 135 was prepared. To this bonding GaP substrate 150, Si and Te were doped till the carrier concentration reached about $2 \times 10^{17}$ cm$^{-3}$. A single crystal having a surface orientation of (111) was used. The bonding GaP substrate 150 measured 50 mm in diameter and 100 μm in thickness. The surface of this GaP substrate 150, prior to being bonded to the p-type GaP layer 135, was polished and finished to 0.12 nm in the root-mean-square (rms) value.

A semiconductor material-mounting device, subsequent to having the GaP substrate 150 and the epitaxial wafer brought therein, was evacuated till a vacuum of $3 \times 10^{-5}$ Pa. Thereafter, the GaP substrate 150 mounted in a device having expelled from therein members made of carbon materials with a view to avoiding contamination as with carbon was kept heated to a temperature of about 800° C. in a vacuum and, meanwhile, the surface of the GaP substrate 150 was irradiated with Ar ions accelerated to an energy of 800 eV. As a result, the bonding layer 14 formed of a nonstoichiometric composition was formed on the surface of the GaP substrate 150. Subsequent to the formation of the bonding layer 14, the radiation of the Ar ions was stopped and the temperature of the GaP substrate 150 was lowered to room temperature.

Then, the surfaces of both the GaP substrate 150 incorporating in the surface region thereof the bonding layer 14 formed of the nonstoichiometric composition and the GaP layer 135 were irradiated with an Ar beam neutralized by the bombardment of electrons over a period of 3 minutes. Thereafter, in a mounting device maintaining a vacuum, the surfaces of these two layers 135 and 150 were piled up and then mutually bonded at room temperature under a load adjusted to produce a pressure of 20 g/cm$^2$ on each of the surfaces. The resultant bonded wafer was taken out of the vacuum chamber of the mounting device and the interfaces of bonding in the wafer were analyzed. The bonding layer 14 formed of $Ga_{0.6}P_{0.4}$ and having a nonstoichiometric composition was detected in the bonded part. The bonding layer 14 had a thickness of about 3 nm and an oxygen atom concentration of $7 \times 10^{18}$ cm$^{-3}$ as determined by the ordinary SIMS method and a carbon atom concentration of $9 \times 10^{18}$ cm$^{-3}$.

Then, the GaAs substrate 11 and the GaAs buffer layer 130 were selectively removed with an ammonia-based etchant. On the exposed surface of the contact layer 131, an AuGe—Ni alloy film and an Au film were deposited in respective thicknesses of 0.2 μm and 0.1 μm by the vacuum deposition method. The n-type ohmic electrode 15 was formed by a patterning work utilizing the ordinary photolithographic means. Next, the surface of the contact layer 131 and the surface of the n-type ohmic electrode 15 were coated with an indium-tin complex oxide (ITO) film formed in a thickness of 0.5 μm by utilizing the ordinary sputtering device. Further, on the ITO surface, a chromium (Cr) thin film of a thickness of 0.03 μm and a gold (Au) thin film of a thickness of 1 μm were sequentially stacked by the sputtering method and a bonding pad measuring 110 μm in diameter was formed.

Then, the GaP layer 135 was exposed by selectively removing the epitaxial layers 131 to 134 from the region forming the p-electrode. On the surface of the GaP layer, AuBe, Pt and Au were deposited in respective thicknesses of 0.2 μm, 0.2 μm and 1 μm by the vacuum deposition method to form the p-type ohmic electrode 16. By performing a heat treatment at 45° C. for 10 minutes, alloyed low-resistance p-type and n-type ohmic electrodes were formed.

The wafer consequently obtained was cut at intervals of 250 μm by the use of an ordinary dicing saw to obtain LED chips 10 having a nearly square shape in a plan view. After the dicing work, the lateral face parts of the semiconductor layers forming the epitaxial wafers resulting from the cutting were etched with a mixed sulfuric acid and hydrogen peroxide liquid for the purpose of removing the damaged layers generated in the cut lateral faces.

Then, the irregularities having a difference of height of about 2 μm were formed on a back surface and lateral surfaces of the GaP substrate through the treatment with hydrochloric acid.

The LED chips 10 fabricated were joined together to assemble a light-emitting diode lamp. This LED lamp was fabricated by fixing and mounting this lamp on a mounting substrate with silver (Ag) paste, wire-bonding the n-type ohmic electrode 15 of the LED chip 10 to the n-electrode terminal disposed on the surface of the mounting substrate and as well the p-type ohmic electrode 16 to the p-electrode terminal with a gold wire, and sealing them with an ordinary epoxy resin. The shear strength exerted on the bonding surface between the substrate and the LED chip 10 was about 300 g or more. Since the breaking mode consisted in separating individual LED chips 10 by breakage, the bonding strength of the bonding surface was interpreted as exceeding the breaking strength of the crystal layers forming the epitaxial wafer.

When the flow of an electric current between the n-type and p-type ohmic electrodes 15 and 16 was established via the n-electrode terminal and the p-electrode terminal disposed on the surface of the mounting substrate, the emission of a light in red color having a main wavelength of 620 nm ensued. The forward voltage ($V_f$) during the flow of an electric current of 20 mA in the forward direction was about 2.2 V, a fact that reflected the good ohmic characteristics of the ohmic electrodes 15 and 16. The intensity of light emission during the flow of an electric current of 20 mA in the forward direction reached high luminance of 520 mcd, a fact that reflected the structure of the light-emitting part exhibiting a high efficiency of light emission and the enhancement of the efficiency of extraction of light to the exterior as by the removal of damaged layers produced while the wafer was separated into chips by cutting.

Since the light-emitting device of the present example abounds in luminance and has small height similar to the GaN-based light-emitting device, it is convenient for being fabricated into a white light-emitting device, for example, in combination with the GaN-based light-emitting device.

EXAMPLE 6

A light-emitting diode 10 was fabricated by using an epitaxial wafer that was provided with semiconductor layers 13 sequentially stacked on a semiconductor substrate 11 formed of an Si-doped n-type GaAs single crystal. The GaAs substrate 11 used herein was of a type having a plane direction extended toward the direction <01-1> from the face (100) and inclined by 15° in the direction of expressing the face (111)B. The term "stacked semiconductor layers" refers to a buffer layer 130 formed of Si-doped n-type $(Al_{0.5}Ga_{0.5})_{0.5}In_{0.5}P$, a contact layer 131 formed of Si-doped n-type GaAs, a lower clad layer 132 formed of Si-doped n-type $(Al_{0.7}Ga_{0.3})_{0.5}In_{0.5}P$, a light-emitting layer 133 formed of 20 pairs of undoped $(Al_{0.2}Ga_{0.8})_{0.5}In_{0.5}P$ and $(Al_{0.7}Ga_{0.3})_{0.5}In_{0.5}P$, an intermediate layer 134 composed of an upper clad layer formed of Mg-doped p-type $(Al_{0.7}Ga_{0.3})_{0.5}In_{0.5}P$ and a thin film formed of $(Al_{0.5}Ga_{0.5})_{0.5}In_{0.5}P$, and an Mg-doped p-type GaP layer 135 destined to serve as an ohmic contact forming layer.

The $(Al_{0.5}Ga_{0.5})_{0.5}In_{0.5}P$ etching stop layer (buffer layer) 130 had a carrier concentration of about $2 \times 10^{18}$ cm$^{-3}$ and a layer thickness of about 0.2 μm The contact layer 131 was formed of GaAs and had a carrier concentration of about $2 \times 10^{18}$ cm$^{-3}$ and a layer thickness of about 0.2 μm. The n-clad layer 132 had a carrier concentration of about $8 \times 10^{17}$ cm$^{-3}$ and a layer thickness of about 2 μm. The light-emitting layer 133 was an undoped layer having a thickness of 0.8 μm. The p-clad layer 134 had a carrier concentration of about $2 \times 10^{17}$ cm$^{-3}$ and a layer thickness of 1 μm. The GaP layer 135 had a carrier concentration of about $3 \times 10^{18}$ cm$^{-3}$ and a layer thickness of 9 μm.

The p-type GaP layer 135 had a region thereof reaching a depth of about 1 μm from the surface polished till a mirror finish. By the mirror-polishing work, the surface of the p-type GaP layer 135 was given roughness of 0.18 nm.

Meanwhile, a GaP substrate 150 to be mounted on the mirror-polished surface of the p-type GaP layer 135 was prepared. The GaP substrate 150 to be mounted had a diameter of 50 mm and a thickness of 250 μm. The surface of this GaP substrate 150, prior to being bonded to the p-type GaP layer 135, was mirror-polished and finished with a roughness of 0.12 nm by the root-mean-square value.

A bonding device, after having the GaP substrate 150 and an epitaxial wafer brought therein, was evacuated till vacuum Subsequently, the surfaces of the GaP substrate 150 and the epitaxial wafer were irradiated with an accelerated Ar beam as a preparatory treatment for the bonding with a view to freeing the surfaces of contamination. Thereafter, they were bonded mutually in a vacuum at room temperature.

Then, the GaAs substrate 11 was selectively removed from the bonded wafer with an ammonia-based etchant. Subsequently, the etching stop layer 130 was removed with hydrochloric acid.

On the surface of the contact layer 131, an n-type ohmic electrode was formed as a first ohmic electrode 15 by depositing an AuGe—Ni alloy in an expected thickness of 0.2 μm in accordance with the vacuum deposition method. This electrode was subjected to patterning by utilizing an ordinary means of photolithography to complete the electrode 15. Thereafter, the contact layer excluding the electrode-forming part was removed.

Then, the GaP layer 135 which was an ohmic contact forming layer was exposed by removing the epitaxial layers 131 to 134 inclusive of the light-emitting layer of the region forming the p-electrode with an Br—CH$_3$OH etchant. On the surface of the GaP layer, AuBe and Au were deposited in respective expected thicknesses of 0.2 μm and 1 μm by the vacuum deposition method to form the p-type ohmiic electrode 16. By a heat treatment performed at 450° C. for 10 minutes, alloyed low-resistance p-type and n-type ohmic electrodes were formed.

The resultant wafer was cut with a dicing saw and transformed into chips. The damaged layers resulting from the dicing work and the contamination were removed with a mixed sulfuric acid and hydrogen peroxide liquid to complete fabrication of a semiconductor light-emitting diode (chip) 10.

When the fabricated semiconductor light-emitting diode chip, for the purpose of being mounted, was subjected to the action of an automatic bonding device, no failure due to deficiency in optical recognition was detected owing to the excellent condition of the electrode surface.

This invention is not limited to the embodiment described above. In the present example, the ohmic electrode 15, for example, was formed from such a simple structure as illustrated in FIG. 1. As concrete examples of the shape of the electrode, dots, a lattice, a circle and a square in a plan view, and combinations thereof may be cited. The pattern of the electrode may be selected so as to suit diffusion of electric current.

INDUSTRIAL APPLICABILITY

The lamp fabricated by using the light-emitting diode of this invention abounds in luminance and excels in electrostatic breakdown voltage property and, therefore, can be utilized in various kinds of display devices and lighting fixtures.

The invention claimed is:

1. A light-emitting diode comprising a compound semiconductor layer including a p-n junction-type light-emitting part, an electric conductor disposed on the compound semiconductor layer and formed of an electrically conductive material optically transparent to light emitted from the light-emitting part, a high resistance layer possessing higher resistance than the electric conductor and provided in a middle between the compound semiconductor layer and the electric conductor, and a second compound semiconductor layer of a type of conductivity opposite to the electric conductor, which layer is bonded to a surface of the high resistant layer opposite to a side thereof bonded to the electric conductor;

wherein a breakdown voltage of a bond formed of the electric conductor, the high resistance layer and the second compound semiconductor layer during a flow of an electric current of 10 μA exceeds 2 times a forward voltage of the light emitting diode during a flow of an electric current of 10 μA and smaller than ½ of a reverse voltage of the light-emitting diode during a flow of an electric current of 10 μA.

2. A light-emitting diode according to claim 1, wherein the high resistance layer is disposed as bonded to the electric conductor.

3. A light-emitting diode according to claim 1, wherein the high resistance layer is formed of an amorphous material or a polycrystalline material containing an amorphous substance and has a thickness of 0.5 nm or more and 10 nm or less.

4. A light-emitting diode according to claim 3, wherein the amorphous material or the polycrystalline material containing an amorphous substance is formed by irradiating a region of a surface side of the semiconductor layer bonded to the electric conductor or a surface side of the electric conductor bonded to the compound semiconductor layer or both surface sides with an ion beam or a neutral beam.

5. A light-emitting diode according to claim 1, wherein the high resistance layer is formed of a compound semiconductor material having a carrier concentration of $5 \times 10^{18}$ cm$^{-3}$ or less.

6. A light-emitting diode according to claim 1, wherein the second compound semiconductor layer is formed of gallium phosphide (GaP).

7. A light-emitting diode according to claim 1, wherein the second compound semiconductor layer has a thickness of 5 μm or more and a carrier concentration of $1 \times 10^{17}$ cm$^{-3}$ or more.

8. A light-emitting diode according to claim 1, wherein the electric conductor is formed of an electrically conductive compound semiconductor material having a thickness of not less than 50 micrometers (unit: μm).

9. A light-emitting diode according to claim 1, wherein the electric conductor is formed of an electrically conductive compound semiconductor material having a thickness of 200 μm or less.

10. A light-emitting diode according to claim 1, wherein the electric conductor is formed of gallium phosphide (GaP).

11. A light-emitting diode according to claim 10, wherein a surface orientation of the electric conductor formed of GaP falls in the face of (111) or inclines within 20° from the (111).

12. A light-emitting diode according to claim 10, wherein a reverse face and lateral faces of the electric conductor formed of GaP have formed thereon irregularities having a difference of height of 1 to 10 μm.

13. A light-emitting diode according to claim 10, wherein the second compound semiconductor layer is of a p-type, and the electric conductor is of an n-type and is formed of GaP doped with Si, S or Te added thereto or retained in an undoped state.

14. A light-emitting diode according to claim 1, wherein the electric conductor has a concentration of $5 \times 10^{18}$ cm$^{-3}$ or less.

15. A light-emitting diode according to claim 1, further comprising a metal layer formed on a surface of the electric conductor on a side opposite to a side having the light-emitting part disposed thereon.

16. A light-emitting diode according to claim 1, wherein a transparent electrically conductive film is formed on the surface of the electric conductor on the side opposite to the side having the light-emitting part disposed thereon.

17. A light-emitting diode according to claim 1, wherein the light-emitting part contains a semiconductor layer formed of a material of a composition represented by formula $(Al_XGa_{1-X})_YIn_{1-Y}P$ ($0 \leqq X \leqq 1$, $0 \leqq Y \leqq 1$).

18. A light-emitting diode according to claim 1, further comprising an n-type electrode and a p-type electrode formed on opposite sides across the light-emitting part and one of the electrodes falling on an electric conductor side is interposed between the light-emitting part and the electric conductor.

19. A light-emitting diode according to claim 1, wherein a surface on which an electrode of an electronic conductor side is to be formed has a surface inclined in a direction of expressing the (111)A face to appear from the (100).

20. A light-emitting diode lamp formed utilizing the light-emitting diode according to claim 1, wherein the electric conductor and an electrode disposed across the transparent layer on the compound semiconductor layer falling on a side opposite to the electric conductor have an identical type of conductivity
and are electrically connected at an approximately identical electric potential.

21. A method for the fabrication of a light-emitting diode that includes a compound semiconductor layer containing a p-n junction-type light-emitting part, an electric conductor disposed as bonded on the compound semiconductor layer and formed of an electrically conductive material optically transparent to light emitted from the light-emitting part, a high resistance layer interposed between the compound semiconductor layer and the electric conductor and possessing higher resistance than the electric conductor, and a second compound semiconductor layer of a type of conductivity opposite to the electric conductor, which layer is bonded to a surface of the high resistant layer opposite to a side thereof bonded to the electric conductor;
wherein a breakdown voltage of a bond formed of the electric conductor, the high resistance layer and the second compound semiconductor layer during a flow of an electric current of 10 μA exceeds 2 times a forward voltage of the light emitting diode during a flow of an electric current of 10 μA and smaller than ½ of a reverse voltage of the light-emitting diode during a flow of an electric current of 10 μA,
the method comprising the step of irradiating a surface side of the compound semiconductor layer bonded to the electric conductor or a surface side of the electric conductor bonded to the compound semiconductor layer with an ion beam or a neutral beam, thereby forming the high resistance layer.

22. A light-emitting diode produced by the method for the fabrication of a light-emitting diode according to claim 21.

* * * * *